(12) United States Patent
Lu et al.

(10) Patent No.: US 7,227,237 B2
(45) Date of Patent: Jun. 5, 2007

(54) SYSTEMS AND METHODS FOR BIASING HIGH FILL-FACTOR SENSOR ARRAYS AND THE LIKE

(75) Inventors: JengPing Lu, San Jose, CA (US); James B. Boyce, deceased, late of Los Altos, CA (US); by Kathleen Dore Boyce, legal representative, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 165 days.

(21) Appl. No.: 10/740,466

(22) Filed: Dec. 22, 2003

(65) Prior Publication Data

US 2005/0133813 A1    Jun. 23, 2005

(51) Int. Cl.
*H01L 31/00* (2006.01)
(52) U.S. Cl. .................................. 257/458; 257/459
(58) Field of Classification Search ................ 257/290, 257/458, 459
See application file for complete search history.

(56) References Cited

U.S. PATENT DOCUMENTS

| | | | | |
|---|---|---|---|---|
| 4,980,747 | A | * | 12/1990 | Hutter et al. ................ 257/513 |
| 5,442,223 | A | * | 8/1995 | Fujii .......................... 257/506 |
| 5,889,314 | A | * | 3/1999 | Hirabayashi ................ 257/508 |
| 6,730,914 | B2 | * | 5/2004 | Chao et al. ............ 250/370.14 |
| 6,953,981 | B1 | * | 10/2005 | Johansson et al. .......... 257/503 |

\* cited by examiner

*Primary Examiner*—Sara Crane
(74) *Attorney, Agent, or Firm*—Oliff and Berridge, PLC

(57) ABSTRACT

A high fill-factor photosensor array is formed comprising a P-layer, an I-layer, one or more semiconductor structures adjacent to the I-layer and each coupled to a N-layer, an electrically conductive electrode formed on top of the P-layer, and an additional semiconductor structure, adjacent to the N-layer and which is electrically connected to a voltage bias source. The bias voltage applied to the additional semiconductor structure charges the additional semiconductor structure, thereby creating a tunneling effect between the N-layer and the P-layer, wherein electrons leave the N-layer and reach the P-layer and the electrically conductive layer. The electrons then migrate and distribute uniformly throughout the electrically conductive layer, which ensures a uniform bias voltage across to the entire photosensor array. The biasing scheme in this invention allows to achieve mass production of photosensors without the use of wire bonding.

24 Claims, 9 Drawing Sheets

SYSTEMS AND METHODS FOR BIASING HIGH FILL-FACTOR SENSOR ARRAYS AND THE LIKE

BACKGROUND OF THE INVENTION

1. Field of Invention

This invention relates generally to devices with rectifying properties that normally work under reverse biasing conditions.

2. Description of Related Art

Devices with rectifying properties, that may normally work under reverse biasing conditions, require the structural ability to include a bias voltage. Such devices may be multilayered structures with positively-doped, or P, layers, and negatively-doped, or N, layers. In some instances, one or several intrinsic, or I, layers, are also part of the device. Devices with rectifying properties and that normally work under reverse bias conditions may have, for instance, PN, NP, NIP or Schottky-junction structures. The related art discussed herein is specific to PIN photosensors for clarification purposes only, but the principles underlined and discussed can also be applied to other structural devices with rectifying properties that normally work under reverse biasing conditions.

High fill-factor structures are structures having a continuous top portion, and a pixelated bottom portion that defines a plurality of pixels or other repeated structures which are often arranged in an array or the like. The continuous top portion is often a positively doped layer and/or a transparent, electrically conductive layer. The pixelated bottom portion is often formed by negatively doped material and a metal contact layer. Such high fill-factor devices have been widely used in CMOS imagers with, for instance, positive-intrinsic-negative (PIN) photosensors and in flat panel images. One of the differences between a high fill-factor sensor array and a conventional sensor array is that, in a conventional sensor array, the top portion and the bottom portions are both pixelated. In contrast, in a high fill-factor structure, the top portion is continuous.

For example, PIN photosensors generally include a positively-doped layer, or p-type layer, an undoped or intrinsic layer, or I-layer and a negatively-doped layer, or n-type layer. In this configuration, the I-layer is excited by photons when the photosensor is exposed to light. When irradiated by photons, the I-layer generates electron-hole pairs that separate under the action of the electric field generated by the built-in potential and the supplied reverse bias, and drift through the I-layer. The electrons drift to the N-layer and the holes drift to the P-layer. When the electrons reach the N-layer through drifting, they travel through the N-layer and reach one or more signal electrodes. The signal electrodes then transmit those electrons to one or more downstream circuits.

When these PIN photosensors are arranged in an array, each individual photosensor generates an electrical current proportional to the amount of electrons that drift to the portion of the N-layer that is associated with that photosensor structure. Since the amount of electrons drifting out of the I-layer depends upon the light intensity that irradiates the I-layer, the amount of electrons that reach the N-layer and travel to the signal electrodes also depends on the intensity of the light that irradiates the portion of the I-layer that is associated with that particular semiconductor structure. In other words, the amount of charge that is generated by each individual photosensor depends directly on the intensity of the light irradiating the portion of the I-layer that is associated with that photosensor. Accordingly, different photosensors generate different charge levels in the same photosensor array as different portions of the I-layer are irradiated by different amounts of light.

For the electrons to drift through the I-layer and into the N-layer, a voltage bias should be applied to the photosensor structure. The most common technique used to apply this bias voltage to the photosensor structure is to add an additional transparent conductive electrode in the form of a layer on top of the P-layer, and to connect that transparent conductive layer to a voltage source.

The P-layer is thus generally covered by a transparent, electrically conductive layer. It should be understood that the transparent, electrically conductive layer needs to be transparent at the wavelength range of the electromagnetic radiation that the photosensor is designed to sense. In general, this transparent, electrically conductive layer has no role in transmitting the light intensity signal and should not interfere with the light intensity signal by altering, for instance, the intensity or the wavelength of the light intensity signal. It should further be understood that the transparent, electrically conductive layer should be applied over the entire surface of the photosensor to provide a uniform distribution of bias voltage over the entire photosensor array. A uniform distribution of bias voltage ensures that the relative number of electrons that drift through the I-layer and to the N-layer is proportional only to the intensity of light that is being irradiated on the I-layer, i.e., that it is not due to local differences in bias voltage across the P-layer or across the I-layer.

U.S. Pat. No. 6,018,187 describes a PIN layer in which a transparent conductive layer, formed over the P-layer, is electrically connected to a bias voltage source.

SUMMARY OF THE DISCLOSURE

One of the problems in high fill-factor structures, such as the photosensor array described above, that operate under reverse bias conditions, lies in the increased manufacturing effort and corresponding costs incurred by the need to electrically connect the transparent, electrically conductive layer to the bias voltage source. This connection, generally done by wire bonding, often presents problems in that it is difficult to reliably bond the wire to the transparent conductive layer. This often occurs because the transparent conductive layer is generally made, for instance, out of a ceramic, which can be difficult to wire bond to. Another problem associated with the above-outlined biasing scheme is that when mass producing photosensors, additional processing steps to connect the transparent, electrically conductive layer to the bias voltage source are needed. Accordingly, these additional steps and structural features tend to increase the production costs when mass producing photosensors and to reduce the yield rate and reliability of the photosensors.

This invention provides devices, systems and methods for biasing a semiconductor structure that operates under reverse biasing conditions.

This invention provides devices, systems and methods for biasing a photosensor array.

This invention separately provides devices, systems and methods that avoid connecting a bias voltage to an electrically conductive layer using a wire bond.

This invention separately provides devices, systems and methods that use one or more additional semiconductor structures to bias the semiconductor device operating under reverse bias conditions.

This invention separately provides systems and methods that use the same processing steps, used to form the semiconductor device operating under reverse bias conditions, to form a semiconductor structure of the semiconductor device that is usable to bias the semiconductor device operating under reverse bias conditions.

In various exemplary embodiments of this invention, the additional semiconductor structure is a semiconductor structure selected from the semiconductor structures that are part of the semiconductor device operating under reverse bias conditions.

In various exemplary embodiments of the devices, systems and method according to this invention, the electrically conductive layer is connected to a voltage source through one or more additional semiconductor structures that are part of the same device as the device elements of the semiconductor device operating under reverse bias conditions. The additional semiconductor structures are formed by adding one or more units of the semiconductor device. For example, for a PIN photo sensor, the additional semiconductor structure comprises an N-layer and an underlying signal electrode which, in conjunction with the I-layer and the P-layer of the PIN photosensor, constitute one or more additional semiconductor structures added to the device carrying the photosensor array.

In various exemplary embodiments of the devices, systems and methods according to this invention, when a bias voltage is applied to one or more of the additional semiconductor structures, the bias voltage passes through the additional semiconductor structure to the common electrode. For example, in forward-biased PIN diodes, the N-layer of that semiconductor structure will become charged, and electrons will eventually drift out of the N-layer, through the I-layer, and reach the P-layer. Since the transparent, electrically conductive layer is conductively coupled to the P-layer, the electrons coming from the N-layer will propagate in the transparent, electrically conductive layer. Upon reaching the electrically conductive layer, the electrons migrate and distribute uniformly throughout the electrically conductive layer. The uniform distribution of electrons in the electrically conductive layer contributes to ensuring a uniform bias voltage is applied to the entire semiconductor device.

In various exemplary embodiments of the systems, methods and devices according to this invention, the electrically conductive electrode may be a transparent, electrically conductive oxide. In various exemplary embodiments of this invention, the transparent, electrically conductive oxide may be formed using indium titanium oxide (ITO). The transparent, electrically conductive oxide may be formed using a known or later-developed conductive oxide that is transparent at wavelengths to be sensed.

In various exemplary embodiments of the systems, methods and devices according to this invention, a negative feedback circuit is added to the semiconductor device, connected in series to the one or more additional semiconductor structures to counter the dynamic resistance of the one or more additional semiconductor structures, should the dynamic resistance of the one or more additional semiconductor structures become too high.

In various exemplary embodiments of the systems, methods and devices according to this invention, a guard ring structure is added to the semiconductor device to trap any dark current that may arise from excess charge created by the bias voltage in the vicinity of the one or more additional semiconductor structures and that would affect any nearby elements of the semiconductor device.

In various exemplary embodiments of the systems, methods and devices according to this invention, the one or more additional semiconductor structures are located at a distance sufficiently far from the nearest elements of the semiconductor device so that any dark current that may arise because of the excess charge in the vicinity of the one or more additional semiconductor structures is dampened by the distance between the additional semiconductor structures and the closest elements of the semiconductor device.

These and other features and advantages of various exemplary embodiments of systems and methods according to this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention will be described in detail, with reference to the following figures, wherein.

DETAILED DESCRIPTION OF EXEMPLARY EMBODIMENTS

The following detailed description of various exemplary embodiments of the high fill-factor devices that have a rectifying function and/or operate under reverse biasing conditions according to this invention may refer to one specific type of system, a PIN photosensor, for sake of clarity and familiarity. However, it should be appreciated that the principles of this invention, as outlined and/or discussed below, can be equally applied to any known or later-developed high fill-factor device and/or to any known or later-developed devices that have a rectifying function and/or that operate under reverse biasing conditions, such as NP structures, PN structures, NIP structures, Schottky-junctions structures, or any other structures, beyond the PIN photosensor specifically discussed herein.

Typically, a high fill-factor photosensor array includes a P-layer, an I-layer, a patterned N-layer, one or more signal electrodes adjacent and electrically connected to the patterned N-layer portions and a transparent, electrically conductive layer formed on top of the P-layer. A signal electrode and corresponding portions of each of the patterned N-layer, the I-layer, and the P-layer combine to form a semiconductor structure, such as, for example, a diode. In various exemplary embodiments according to this convention, one or more additional semiconductor structures, such as, for example, forward-biased diodes, are disposed among the other semiconductor structures in the photosensor array and are electrically connected to a bias voltage source. The bias voltage applied to the one or more additional semiconductor structures charges the photosensor array, where electrons leave the N-layer, travel through the I-layer and reach the P-layer and the transparent, electrically conductive layer. The electrons then migrate, from the portion of the P-layer associated with the one or more additional semiconductor structures into, and distribute uniformly throughout, the transparent, electrically conductive layer. This uniform distribution of the charge in the transparent, electrically conductive layer ensures a uniform bias voltage applied to the photosensor array.

Figure 1:
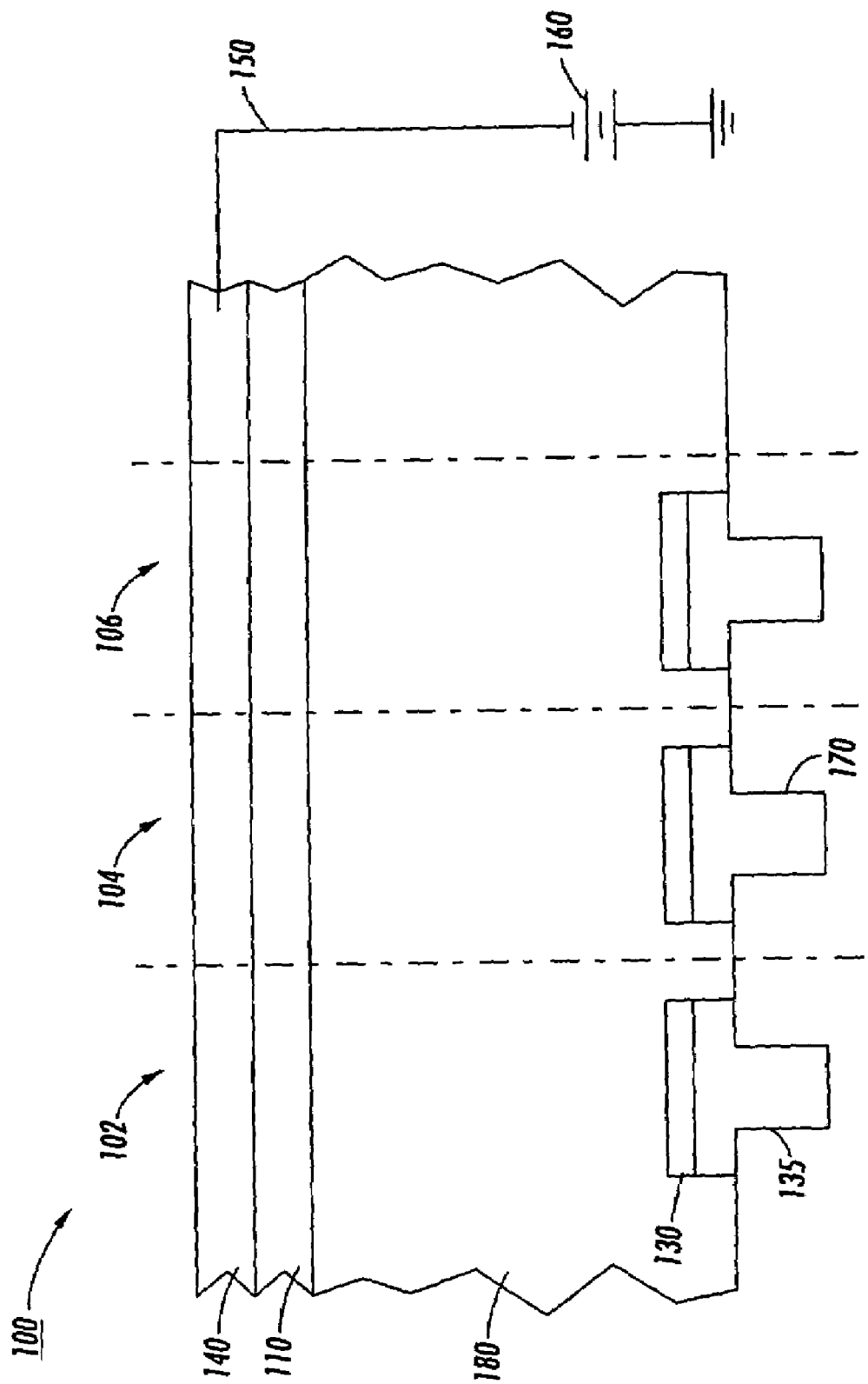
FIG. 1 shows the structure and biasing scheme of a conventional high fill-factor photosensor array.

FIG. 1 illustrates a conventional high fill-factor photosensor array 100 that uses a conventional structure to apply the bias voltage to the P-layer. The photosensor array 100 includes an I-layer 120, formed, for example, of silicon, sandwiched between a P-layer 110 and an N-layer 130. A transparent, electrically conductive layer 140, comprising, for instance, indium titanium oxide (ITO), is formed on or over the P-layer 110 to allow the application of a bias voltage to the photosensor array 100. The transparent, electrically conductive layer 140 should be transparent to any irradiation wavelength to which the photosensor 100 is designed to be sensitive. In order to apply the bias voltage, the most generally used technique is to electrically connect the transparent, electrically conductive layer 140 to a voltage source 160 via a conductive wire or lead 150.

In the photosensor array 100, in operation, the I-layer 120 is irradiated by a radiation source, and consequently generates electrons due to the irradiation, which drift out of the I-layer 120 and reach the N-layer 130. When the electrons reach the N-layer 130, they travel through the N-layer 130 and reach the underlying signal electrodes 135. When the electrons reach the underlying signal electrodes 135, the underlying signal electrodes 135 generate an electrical current which is transmitted to, for instance, an underlying CMOS circuit.

In the context of a two-dimensional array, each underlying signal electrode 135 and its corresponding N-layer 130, I-layer 120 and P-layer 110, correspond to a semiconductor structure 170, such as, for example, a single pixel diode. Accordingly, each single semiconductor structure 170, when irradiated, generate an electrical current in response to the radiation which reaches the portion of the P-layer 110 that is associated with that particular semiconductor structure 170. The amplitude of the electrical current generated by the semiconductor structure 170 is proportional to the intensity of the light irradiating the portion of the P-layer 110 associated with that individual semiconductor structure 170, since the amount of electrons reaching the underlying signal electrode 135 and coming from the P-layer 110 depends on the intensity of the irradiating light. Accordingly, different semiconductor structures 170 may generate electrical currents of different intensities when the intensity of the irradiating light is non-uniform across the P-layer 110 and across the different portions 102-106 of the photosensor 100 that are associated with different semiconductor structures 170. Each semiconductor structure 170 represents a single pixel in the photosensor array, which represents a single pixel in an image generated as a result of exposing the photosensor 100 to radiation.

Figure 2:
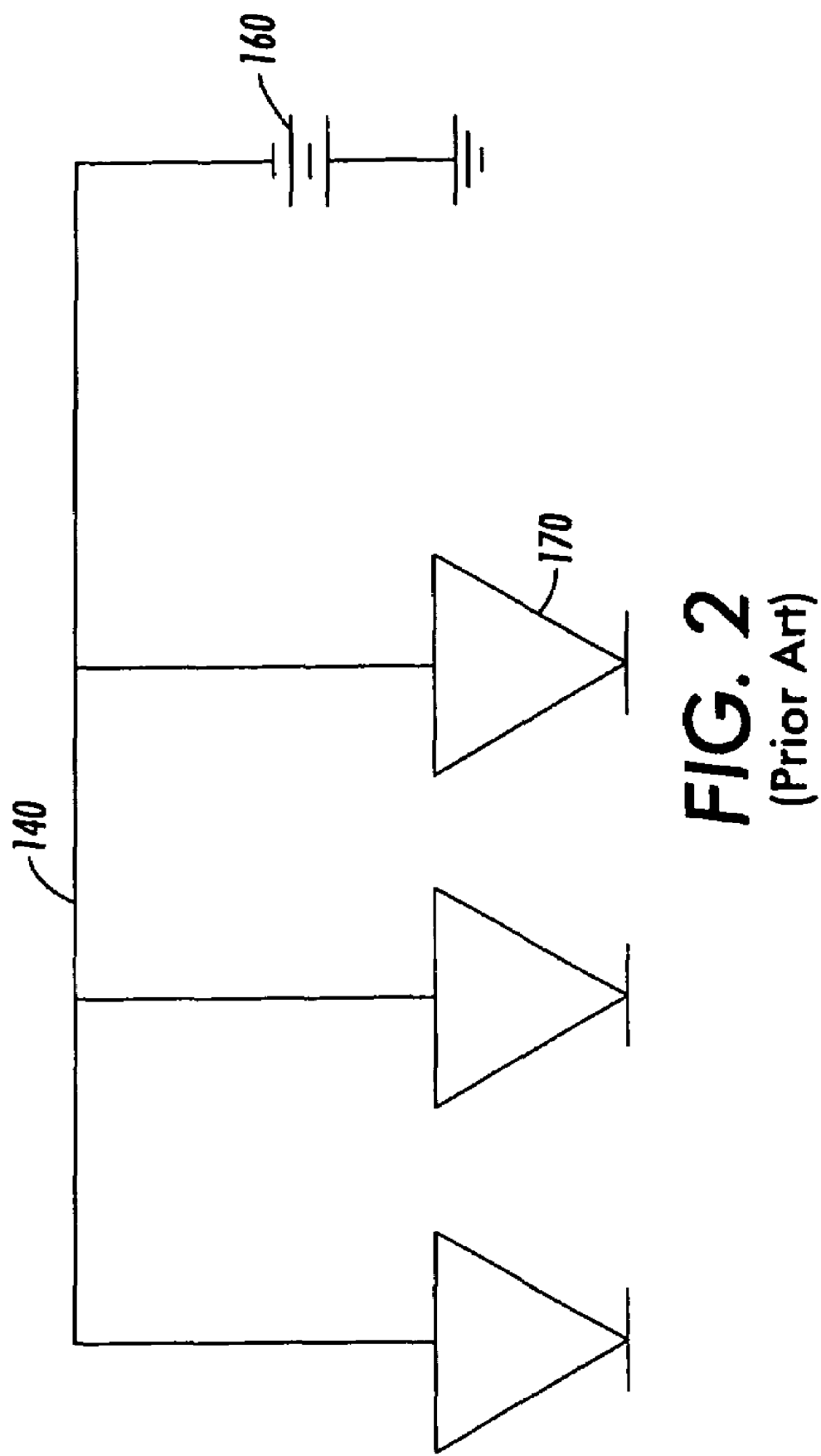
FIG. 2 shows an equivalent circuit for the high fill-factor photosensor array shown in FIG. 1.

FIG. 2 shows an equivalent circuit for the high fill-factor photosensor array 100 shown in FIG. 1. The bias voltage source 160 is shown connected to the semiconductor structures 170 through a common electrode, i.e., the transparent, electrically conductive layer 140.

Figure 3:
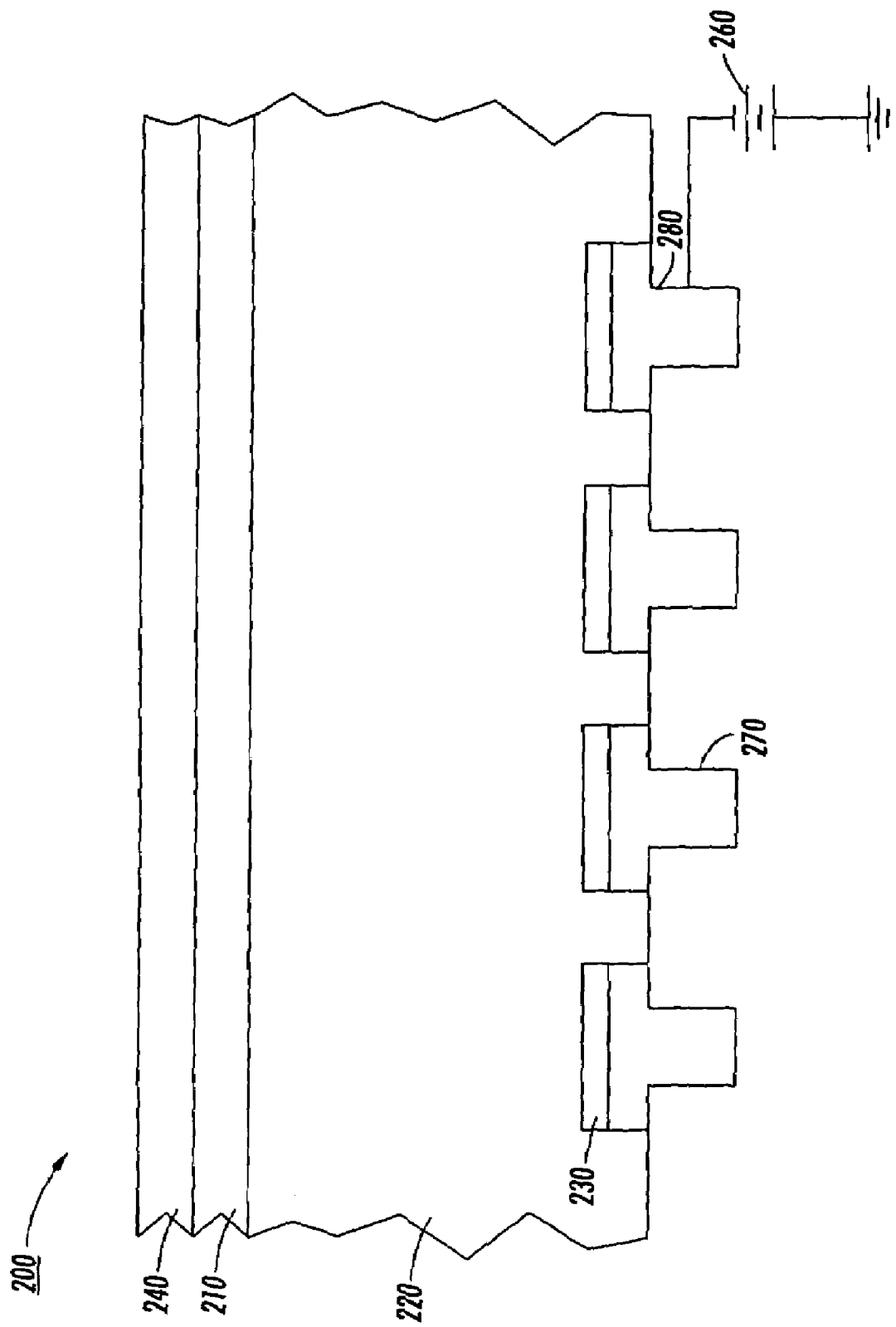
FIG. 3 shows a first exemplary embodiment of a photosensor device that includes a biasing structure according to this invention.

FIG. 3 shows one exemplary embodiment of a high fill-factor photosensor array 200 according to this invention. In the photosensor array 200 shown in FIG. 3, the I-layer 220 generates electrons when irradiated by light. The electrons travel by drifting out of the I-layer 220 and reach the N-layer 230. The N-layer 230 transmits the electrons to the underlying signal electrode 235 of a particular semiconductor structure 270 and an electrical current is generated. This electrical current is transmitted to an underlying circuit.

In various exemplary embodiments according to this invention, the transparent, electrically conductive layer 240, provided on top of the P-layer 210, is not electrically charged by a wire connected to a voltage bias source. Rather, the transparent, electrically conductive layer 240 is charged by an additional semiconductor structure 280 of the high fill-factor photosensor array 200 that is connected to a voltage bias source 260. In various embodiments of this invention, the bias voltage applied by the voltage bias source 260 to the additional semiconductor structure 280 causes electrons to drift through the I-layer 220 and reach the portion of the P-layer 210 associated with the additional semiconductor structure 280. These drifting electrons then migrate from the P-layer portion of the additional semiconductor structure 280 into the transparent, electrically conductive layer 240. This process charges the transparent, electrically conductive layer 240. Since the electrons uniformly distribute throughout the transparent, electrically conductive layer 240, the transparent, electrically conductive layer 240 becomes uniformly charged. The charging of the transparent, electrically conductive layer 240 is merely accomplished by introducing one or more additional semiconductor structures 280, such as, for example, forward-biased diodes, into the photosensor array, provided that the additional semiconductor structures 280 are connected to a bias voltage source 260.

Accordingly, since the bias voltage is applied by the additional semiconductor structure 280, and not by an electrical wire bonded to the transparent, electrically conductive layer 240, this exemplary embodiment of the high fill-factor photosensor array 200 according to this invention avoids using wire bonding, and hence eliminates the need for additional processing and manufacturing steps during mass production of the photosensor array 200.

Figure 4:
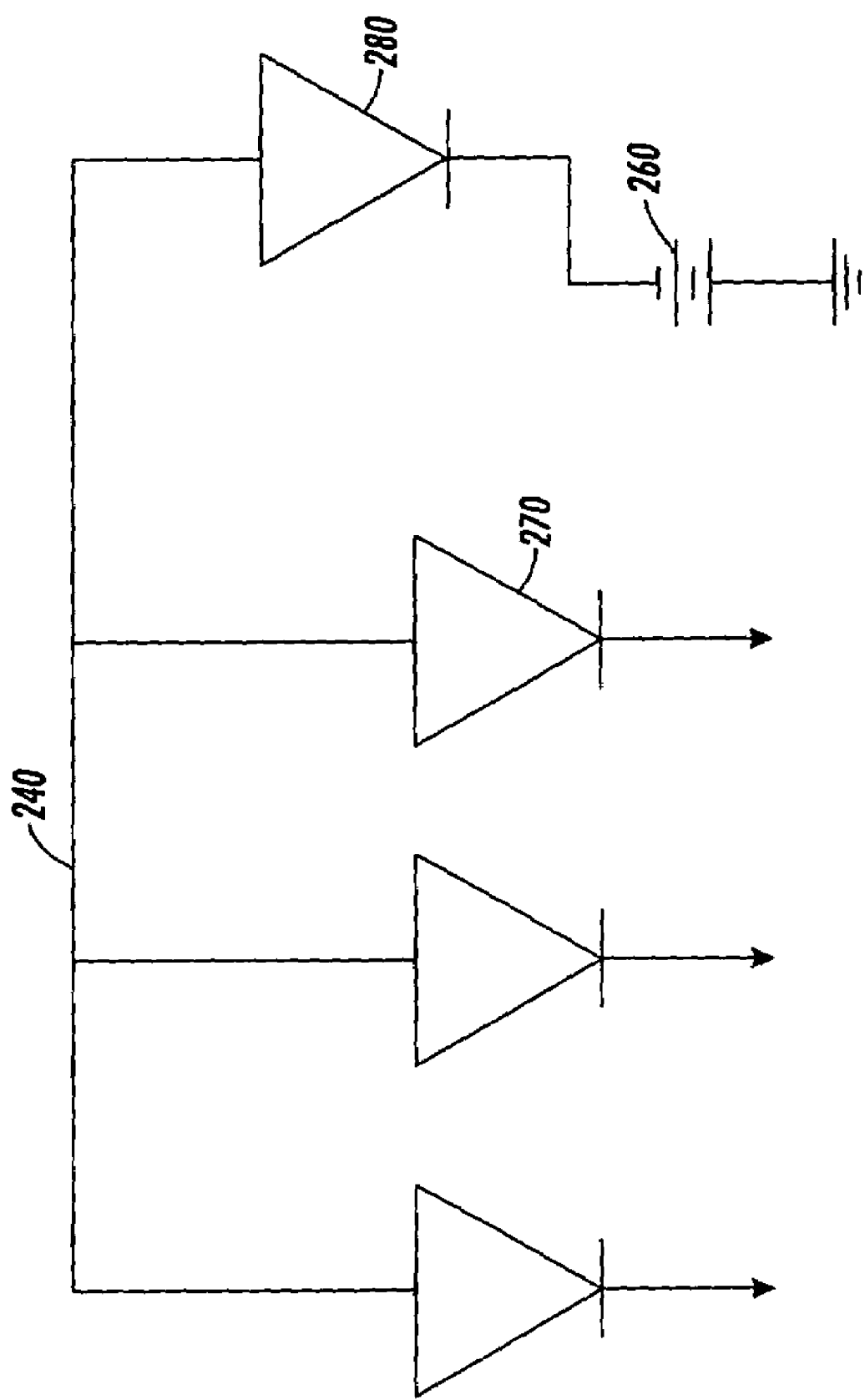
FIG. 4 shows an equivalent circuit for the second exemplary embodiment of a photosensor device that includes a biasing structure and additional circuit elements as shown in FIG. 3.

FIG. 4 shows an equivalent electrical circuit for the high fill-factor photosensor array 200. In contrast to the equivalent circuit illustrated in FIG. 2, in the high fill-factor photosensor array 200, as shown in FIGS. 3 and 4, the voltage bias source 260 is connected to the transparent, electrically conductive layer 240 by the additional semiconductor structure 280.

In various exemplary embodiments of the high fill-factor photosensor array 200 according to this invention, several additional semiconductor structures 280 can be used in the photosensor array 200 to connect the voltage bias source 260 to the transparent, electrically conductive layer 240.

Figure 5:
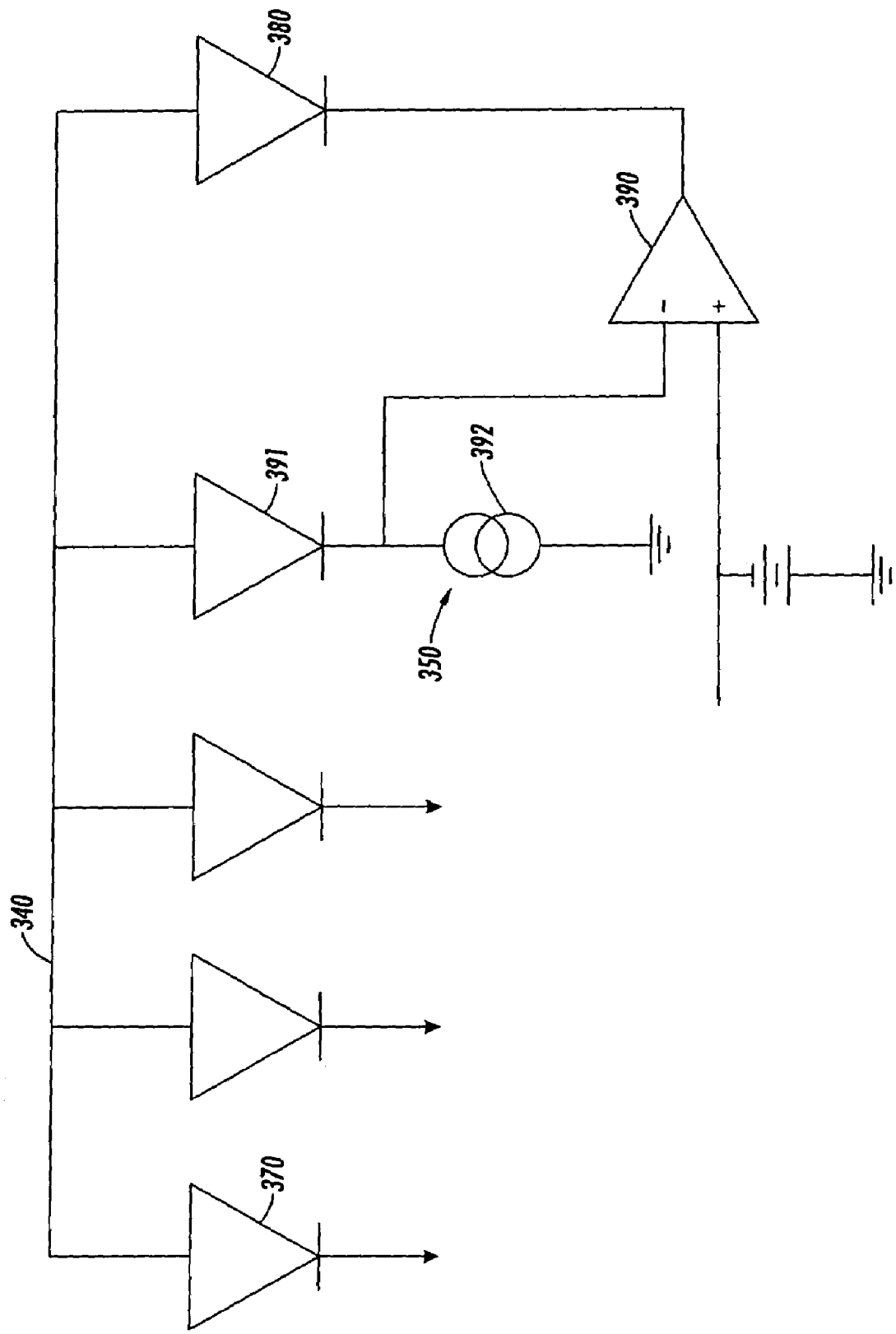
FIG. 5 shows a photosensor device that includes a feedback control loop according to various exemplary embodiments of this invention.

FIG. 5 shows a second exemplary embodiment of a high fill-factor photosensor array 300 according to this invention. As illustrated in FIG. 5, in the high fill-factor photosensor array 300, a negative feedback loop 350 is added to the electrical circuitry of the high fill-factor photosensor array 300. This negative feedback loop 350 can be used to reduce the effective resistance of the one or more additional semiconductor structures 380. Although the effective resistance of the one or more additional semiconductor structures 380 is generally small, in the cases where the effective resistance of the one or more additional semiconductor structures 380 is not sufficiently small, i.e., is too large, the negative feedback loop 350 adjusts the output that drives the one or more additional semiconductor structures 380 to keep a constant voltage applied to the transparent, electrically conductive layer 340.

The negative feedback loop 350 adjusts the output by reducing the effective resistance of the additional semiconductor structure 380 to a negligible value. It should be appreciated that the effective resistance of the diode may interfere with the change in potential resulting from irradiating the photosensor array. As a result, this change in the effective resistance could cause inconsistency in response from the photosensor array. Accordingly, by adding the negative feedback loop 350, the effective resistance of the additional semiconductor structure 380 has substantially no impact on the performance of the photosensor array 300. In various exemplary embodiments according to this invention, the feedback loop 350 includes an operational amplifier 390, a source of current 392 and a sensing diode 391, which can all be embedded in, and/or formed using, the semiconductor substrate.

In various exemplary embodiments according to this invention, the additional semiconductor structure 280 is placed sufficiently far from the closest semiconductor structure 270 to avoid generating larger dark currents in the vicinity of the additional semiconductor structure 280 that negatively impact the operation of any of the semiconductor structures 270 through accidentally charging the N-layer. In typical photosensor structures, dark currents, which result from accidental electronic discharges from the semiconductor structures, may appear. These dark currents may be enhanced by the presence of a highly charged additional semiconductor structure 280, and may create unwanted electronic discharges near the semiconductor structures 270 located in the vicinity of the charged additional semiconductor structure 280. Accordingly, in various exemplary embodiments according to this invention, the one or more additional semiconductor structures 280 are located at a distance sufficiently far from at least one semiconductor structure 270 to preclude the formation of dark currents that are able to negatively affect such neighboring semiconductor structures 270. In various exemplary embodiments according to this invention, a distance sufficiently far from any semiconductor structure 270 will typically be several times the thickness of the semiconductor stack.

Figure 6:
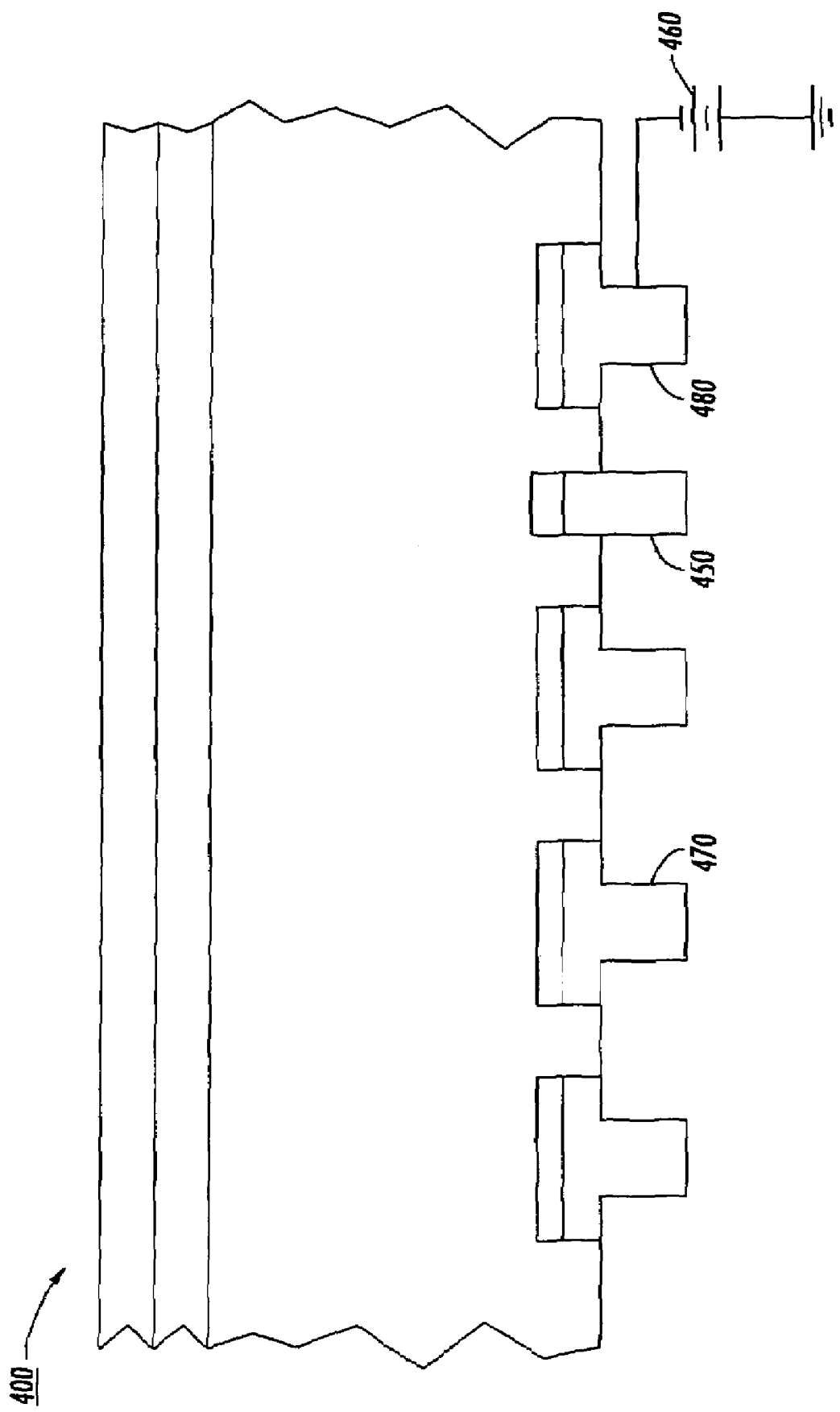
FIG. 6 shows a third exemplary embodiment of a photosensor device and additional structural elements according to this invention.

FIG. 6 shows a third exemplary embodiment of a high fill-factor photosensor array 200 according to this invention. As illustrated in FIG. 6, in various exemplary embodiments according to this invention, a guard ring 450 is provided between the additional semiconductor structure 480 and neighboring semiconductor structures 470. The guard ring 450 tends to trap any dark current that may be created by the charged additional semiconductor structure 480 and that may adversely affect any neighboring semiconductor structures 470. In various exemplary embodiments according to this invention, the guard ring 250 is grounded, and traps any dark currents generated by the additional semiconductor structures 480. As illustrated in FIG. 6, the guard ring 450 is located between one or more of the one or more additional semiconductor structures 480 and the adjacent semiconductor structures 470, and tends to prevent any dark currents from spilling over to the semiconductor structures 470. Furthermore, adding the guard ring to the high fill-factor photosensor array 400 does not require any additional processing steps in the manufacturing process.

Figure 7:
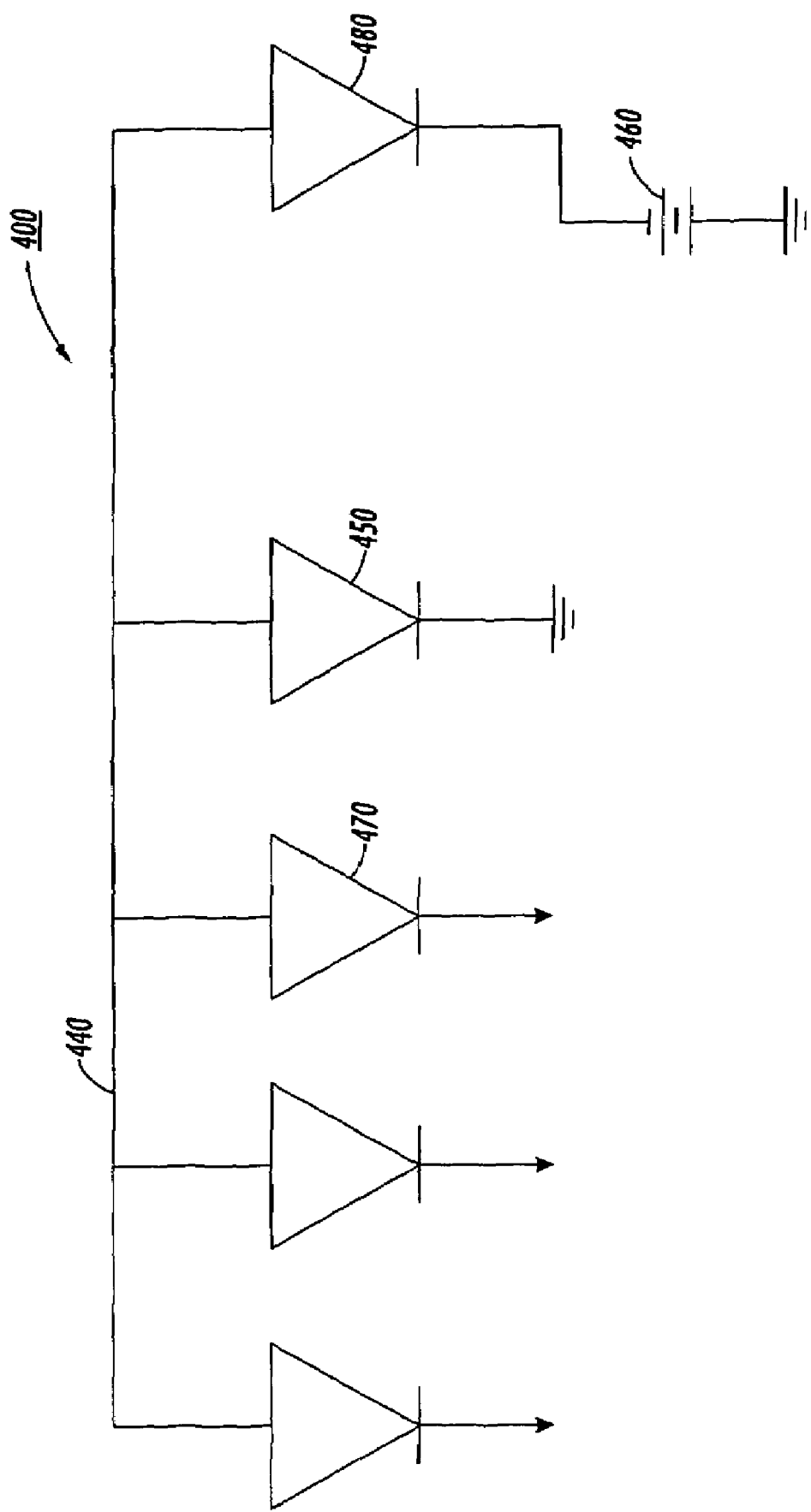
FIG. 7 shows an equivalent circuit for the third exemplary embodiment of the photosensor device shown in FIG. 6.

FIG. 7 shows an equivalent circuit for the high fill-factor photosensor array 400 shown in FIG. 6. The guard ring 450 is connected to the semiconductor structures 470 and the additional semiconductor structures 480 through the common transparent, electrically transparent electrode 440. The bias voltage source 460 is connected to the additional semiconductor structure 480.

Figure 8:
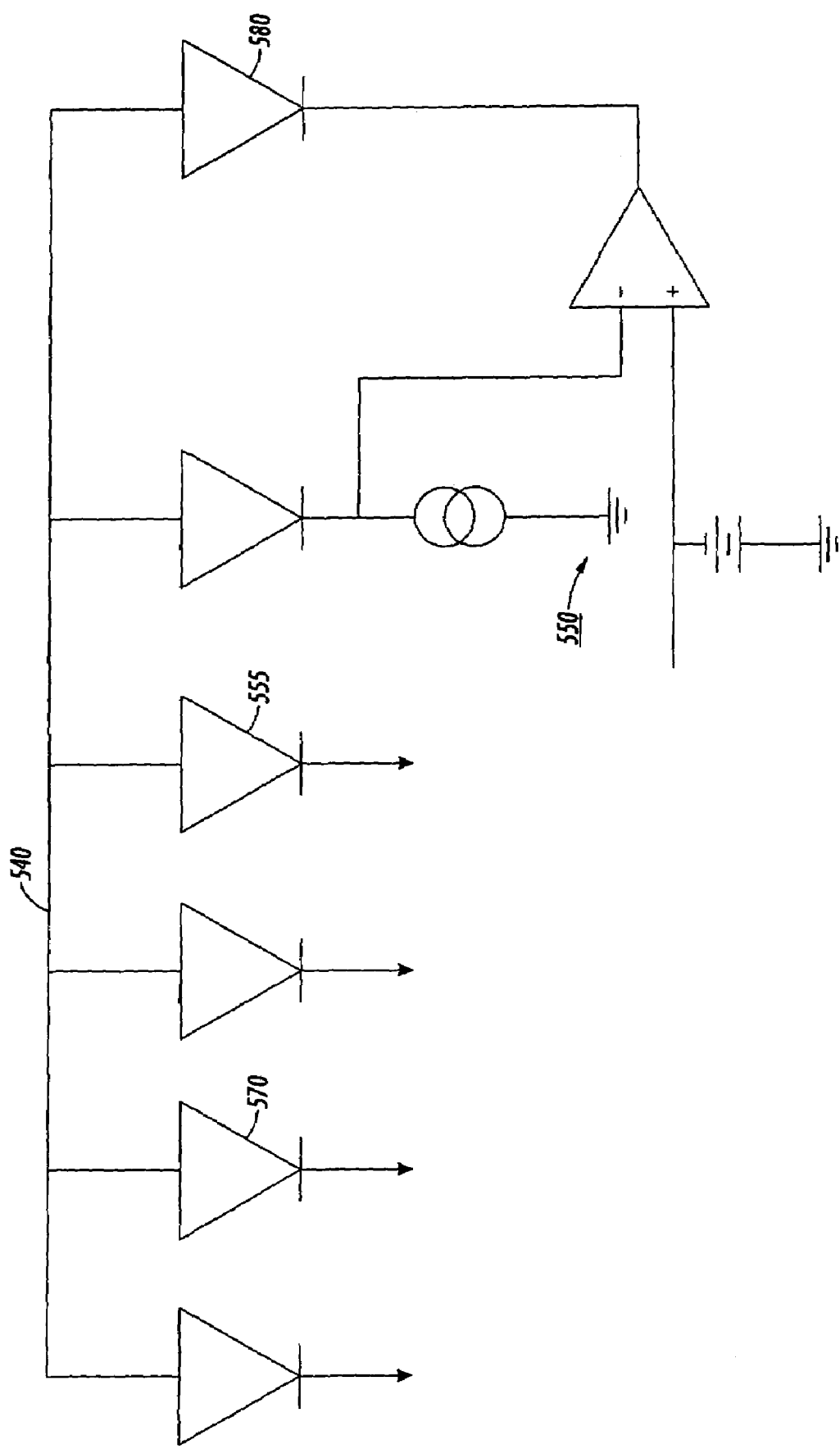
FIG. 8 shows a fourth exemplary embodiment of a photosensor device that includes a biasing structure and additional circuits and structural elements according to this invention.

FIG. 8 illustrates the electrical circuit corresponding to a fourth exemplary embodiment of a high fill-factor photosensor array 500 according to this invention. As shown in FIG. 8, the high fill-factor photosensor array 500 includes both a negative feedback loop 550 and a guard ring 555. The negative feedback loop 550 reduces the effective resistance of the additional semiconductor structure 580, while the guard ring 555 reduces the dark current generated by the additional semiconductor structure 580. In various exemplary embodiments, the combination of the guard ring 555 and the negative feedback loop 550 enhances the performance of the photosensor 500.

Figure 9:
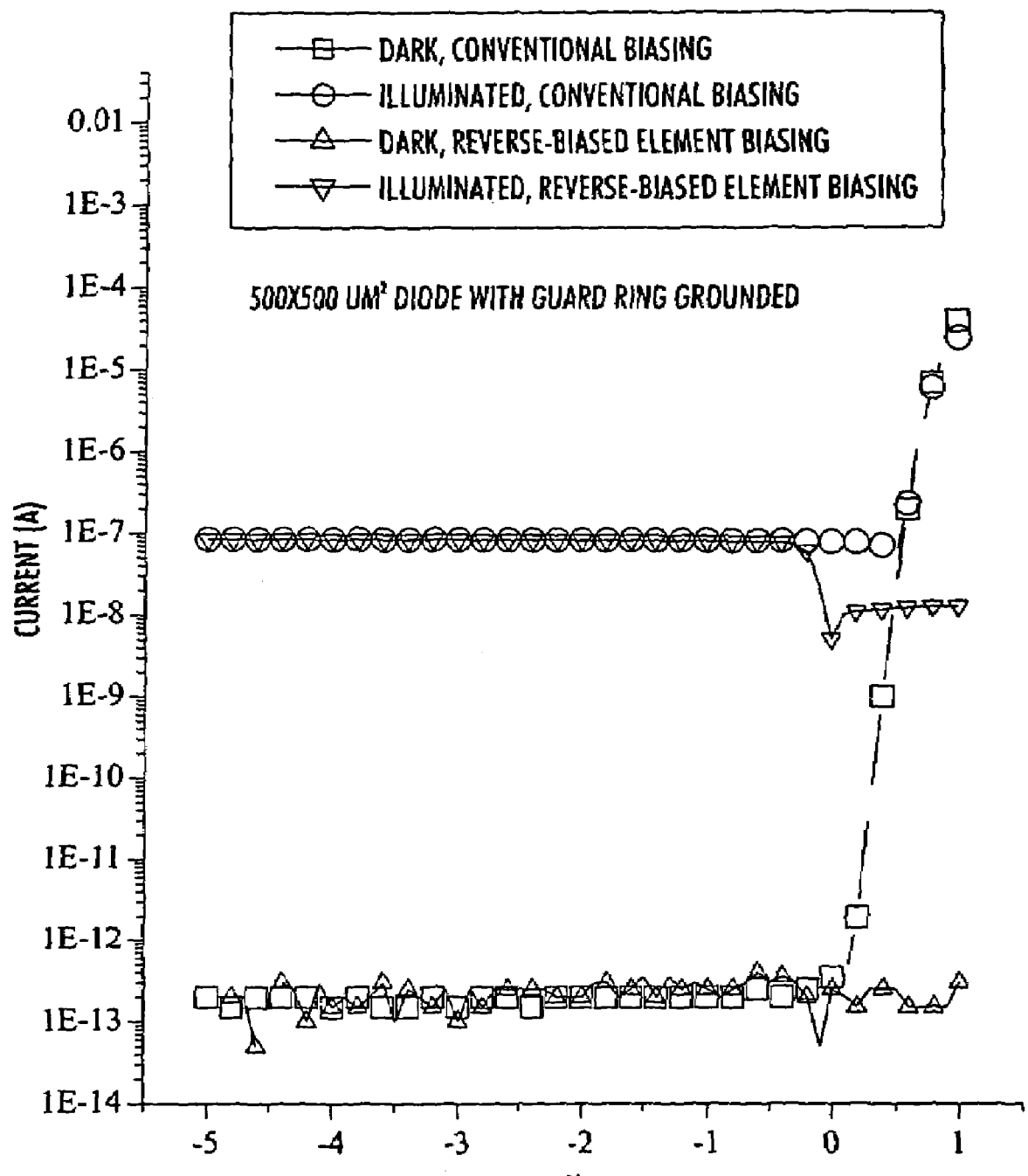
FIG. 9 is a graph showing current v. voltage circuits for a photosensor array using a conventional biasing scheme and for a photosensor device that incorporates one exemplary embodiment of the biasing structure according to this invention.

FIG. 9 is a graph that shows the result of experimental performance tests comparing a photosensor array that uses incorporating various exemplary embodiments of additional semiconductor structures according to this invention to bias the transparent, electrically conductive layer layer, relative to photosensor arrays that use more conventional biasing schemes.

The sensor array used to generate the results shown in FIG. 9 is a 500 μm by 500 μm high fill-factor type of a-Si:H PIN diode with a guard ring. The additional semiconductor structure used to bias the transparent, electrically conductive layer according to this invention is a 200 μm by 200 μm diode, and the guard ring is grounded.

FIG. 9 shows that, between applied voltage biases of −5 volts and −0.5 volts, there is virtually no difference in the current response between a high fill-factor photosensor array 200 according to this invention and a more conventional high fill-factor photosensor array 200. In other words, the performance of the sensor array that incorporates an additional semiconductor structure according to this invention is substantially similar to the performance of a more conventional sensor array, even though the high fill-factor photosensor array 200 that uses an additional semiconductor structure according to this invention has lower manufacturing costs due to a simpler design and less processing steps in the manufacturing process.

There is a slight difference in the range −0.5 volts to 0 volts, between the high fill-factor photosensor array 200 that uses an additional semiconductor structure according to this invention and a more conventional sensor. This discrepancy is due to the cut-in voltage of the additional semiconductor structure 280. The cut-in voltage is the forward-bias voltage of the additional semiconductor structure 280, i.e., is the point at which the current begins to exponentially increase. As shown in FIG. 9, the cut-in voltage is typically 0.6 to 0.7 volts for a silicon diode. If operation of the high fill-factor photosensor array 200 that uses an additional semiconductor structure in this region is absolutely necessary, it is possible to include a negative feedback circuit, as illustrated above in FIGS. 5 and 8, to keep the voltage of the transparent electrically conductive layer constant.

It should be appreciated that although this invention has been described in relation to a PIN diode, the systems, methods and structures according to this invention are usable with other structures containing at least a semiconductor layer and at least a common electrode to which a voltage is applied and where the layers are divided in a plurality of semiconductor structures.

Furthermore, while this invention has been described in conjunction with the exemplary embodiments outlined above, various alternatives, modifications, variations, improvements, and/or substantial equivalents, whether known or that are or may be presently unforseen, may become apparent to those having at least ordinary skill in the art. Accordingly, the exemplary embodiments of the invention, as set forth above, are intended to be illustrative, not limiting. Various changes may be made without departing from the spirit and scope of the invention. Therefore, the invention is intended to embrace all known or later-developed alternatives, modifications variations, improvements, and/or substantial equivalents.

What is claimed is:

1. A device to which a voltage is to be applied, comprising:
    at least one semiconductor layer;
    a plurality of first electrode elements on a first side of the at least one semiconductor layer;
    a common electrode on a second side of the at least one semiconductor layer opposite the plurality of first electrode element;
    wherein a constant voltage bias is applied to the common electrode through a selected one of the plurality of first electrodes, the constant voltage bias causing drifting of electrons from the first side through the at least one semiconductor layer and into the second side, and conducting the drifted electrons to the common electrode.

2. The device of claim 1, wherein the selected one of the plurality of first electrodes is connected to a voltage source that supplies the bias voltage.

3. The device of claim 1, wherein the at least one semiconductor layer and the common electrode are organized into a plurality of device elements by the plurality of first electrodes, such that each device element includes a first electrode, a portion of each of the at least one semiconductor layer and a portion of the common electrode.

4. The device of claim 3, wherein the device elements are at least one of a PN device, an NP device, a PIN device, an NIP device, a Schottky-type device and a device having a rectifying function and/or that operates under reverse bias conditions.

5. The device of claim 3, further comprising a circuit reducing an effective resistance of the device element that includes the selected first electrode.

6. The device of claim 5, wherein the circuit is a negative feedback loop.

7. The device of claim 5, further comprising a grounded guard ring located between the device element that includes the selected first electrode and at least one other one of the plurality of device elements.

8. The device of claim 3, further comprising a grounded guard ring that is located between the device element that includes the selected first electrode and at least one other one of the plurality of device elements.

9. The device of claim 3, wherein the device element that includes the selected first electrode is located at a distance sufficiently far from at least one other one of the plurality of device elements to avoid significantly negatively affecting an operation of that at least one other device element.

10. The device of claim 3, wherein the device elements are diodes.

11. The device of claim 3, wherein at least the device element that includes the selected electrode is a diode.

12. The device of claim 1, wherein the common electrode includes indium titanium oxide.

13. The device of claim 1, wherein the selected first electrode is directly connected to the voltage source.

14. The device of claim 1, wherein the at least one semiconductor layer comprises a positively doped layer relatively adjacent to the common electrode.

15. The device of claim 1, wherein a first one of the at least one semiconductor layer adjacent to, and is patterned corresponding to, the plurality of first electrodes.

16. The device of claim 15, wherein the first layer is one of a positively doped semiconductor layer and a negatively doped semiconductor layer.

17. The device of claim 15, wherein a second one of the at least one semiconductor layer is between the first layer and the common electrode.

18. The device of claim 17, wherein one of the first and second layers is a positively doped semiconductor layer and the other of the first and second layers is a negatively doped semiconductor layer.

19. The device of claim 18, wherein a third one of the at least one semiconductor layer is between the first and second layers.

20. The device of claim 19, wherein the third layer is an intrinsic layer.

21. A method for applying a voltage to a device, the device comprising:
    at least one semiconductor layer;
    a plurality of first electrode elements on a first side of the at least one semiconductor layer;
    a common electrode on a second side of the at least one semiconductor layer opposite the plurality of first electrode element; the method comprising:
    applying a constant voltage to a selected one of the plurality of first electrodes;
    causing drifting of electrons from the first side of the at least one semiconductor layer, through the at least one semiconductor layer, and into the second side of the at least one semiconductor layer; and
    conducting the drifted electrons to the common electrode.

22. The method of claim 21, wherein:
    the device further includes an electrical circuit connected to the selected one of the plurality of first electrodes; and
    the method further comprises reducing an effective resistance of the selected one of the plurality of first electrodes using the electrical circuit.

23. The method of claim 21, wherein:
    the device further includes a guard ring; and
    the method further comprises grounding dark currents generated by the selected one of the plurality of first electrodes using the guard ring.

24. The method of claim 23, wherein:
    the device further comprises an electrical circuit connected to the selected one of the plurality of first electrodes; and
    the method further comprises reducing an effective resistance of the selected one of the plurality of first electrodes using an electrical circuit connected to the selected one of the plurality of first electrodes.

* * * * *